(12) United States Patent
Ranjan et al.

(10) Patent No.: US 11,151,040 B2
(45) Date of Patent: *Oct. 19, 2021

(54) APPROXIMATE CACHE MEMORY

(71) Applicant: Purdue Research Foundation, West Lafayette, IN (US)

(72) Inventors: Ashish Ranjan, Lafayette, IN (US); Swagath Venkataramani, Yonkers, NY (US); Zoha Pajouhi, Portland, OR (US); Rangharajan Venkatesan, Santa Clara, CA (US); Kaushik Roy, West Lafayette, IN (US); Anand Raghunathan, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/362,672

(22) Filed: Mar. 24, 2019

(65) Prior Publication Data
US 2019/0220412 A1    Jul. 18, 2019

Related U.S. Application Data

(63) Continuation of application No. 15/623,343, filed on Jun. 14, 2017, now Pat. No. 10,255,186.

(51) Int. Cl.
*G06F 12/08* (2016.01)
*G06F 12/0846* (2016.01)
(Continued)

(52) U.S. Cl.
CPC ...... *G06F 12/0848* (2013.01); *G06F 12/0846* (2013.01); *G06F 12/0864* (2013.01);
(Continued)

(58) Field of Classification Search
CPC ............ G06F 12/0846; G06F 12/0853; G06F 12/0864
(Continued)

(56) References Cited

U.S. PATENT DOCUMENTS

| | | | |
|---|---|---|---|
| 10,255,186 B2 * | 4/2019 | Ranjan ................ | G06F 12/0846 |
| 2014/0173208 A1 * | 6/2014 | Cho .................... | G06F 12/0897 |
| | | | 711/122 |

OTHER PUBLICATIONS

Ranjan et al., Approximate STorage for Energy Efficient Spintronic Memories. In Proc. DAC, Jun. 2015 (Year: 2015) (Year: 2015).*
(Continued)

*Primary Examiner* — Than Nguyen
(74) *Attorney, Agent, or Firm* — Piroozi-IP, LLC

(57) ABSTRACT

An approximate cache system is disclosed. The system includes a quality aware cache controller (QACC), a cache, a quality table configured to receive addresses and a quality specification from the processor associated with each address and further configured to provide the quality specification for each address to the QACC, wherein the QACC controls approximation is based on one or more of i) approximation through partial read operations; ii) approximation through lower read currents; iii) approximation through skipped write operations; iv) approximation through partial write operations; v) approximations through lower write duration; vi) approximation through lower write currents; and vii) approximations through skipped refreshes.

17 Claims, 10 Drawing Sheets

(51) Int. Cl.
*G06F 12/0891* (2016.01)
*G11C 11/16* (2006.01)
*G06F 12/0864* (2016.01)
*G06F 12/02* (2006.01)

(52) U.S. Cl.
CPC .......... *G06F 12/0891* (2013.01); *G11C 11/16* (2013.01); *G11C 11/1673* (2013.01); *G11C 11/1675* (2013.01); *G06F 12/0238* (2013.01); *G06F 2212/1028* (2013.01); *G06F 2212/604* (2013.01); *G06F 2212/621* (2013.01)

(58) Field of Classification Search
USPC ....................................................... 711/129
See application file for complete search history.

(56) References Cited

OTHER PUBLICATIONS

Ranjan et al., Approximate Storage for Energy Efficient Spintronic Memories. In Proc. DAC, Jun. 2015. (Year: 2015).*

* cited by examiner

APPROXIMATE CACHE MEMORY

CROSS-REFERENCE TO RELATED APPLICATION

The present patent application is related to and claims the priority benefit of U.S. Non-Provisional patent application having Ser. No. 15/623,343, having the title APPROXIMATE CACHE MEMORY filed Jun. 14, 2017, the contents of which is hereby incorporated by reference in its entirety into the present disclosure.

TECHNICAL FIELD

The present disclosure generally relates to integrated circuit memory systems, and more particularly to cache memory systems.

BACKGROUND

This section introduces aspects that may help facilitate a better understanding of the disclosure. Accordingly, these statements are to be read in this light and are not to be understood as admissions about what is or is not prior art.

Growth in amounts of data processed by computing platforms from mobile devices to data centers, together with the need to bridge the increasing processor-memory gap to feed increasing numbers of cores in a computing system have led to an incessant demand for more quick access memory. Memory is divided into off-chip (i.e., off processors) and onchip. Data that is accessed frequently (often referred to as data with temporal locality) or data with nearby addresses (often referred to as data with spatial locality) are often good candidates for storage in onchip cache memory. Caches are divided into a data array and a tag array.

Cache memory architecture is well established. Direct mapping is one such architecture. In direct mapping, cache memory is divided into a data array (e.g., a data table of n rows and one column, where each cell of the table represents a number of data) and a tag array with a similar disposition. An example will further illustrate this architecture. Suppose, a cache of 128B is used, with each row holding 8 bytes. That means the cache has 16 rows of 8B data. In order to have access to each of the 8B data in each row, the address from the processor is divided into three segments: offset, index bits, and tag bits. The three least significant bits are called offsets (or "b" bits). These bits represent which of the 8 bytes of data in a row of interest is being addressed. In this example, the cache system is byte-addressable, i.e., the smallest accessible chunk of data is a byte (8 bits). Therefore, if there are 16B data, b would be 4. The next four least significant bits represent which of the rows of the cache memory is being addressed (or "c" bits). Since there are 16 rows, 4 bits are needed to differentiate between each row. These bits are the index bits. The remaining bits are the tag bits. Where a main memory of size $2^d$ can be represented by d bits, the number of tag bits equal d minus c bits minus b bits. Since cache rows are constantly rewritten, the tag bits represent whether the correct data is held in the cache. Therefore, if the processor is fetching data associated with a particular address, the tag portion of the address (i.e., the most significant d-c-b bits) are compared with the correct location in the cache (based on the c bits); if the tag portion of the address matches the data in the cache tag array, then that is considered a "hit." If, however, there is a discrepancy, that is considered a "miss," in which case the data associated with that tag portion is fetched from the main memory.

Another cache architecture is the set associative architecture. The purpose for this architecture is to avoid collisions of addresses to the same cache location. In this architecture, the data array of the cache memory is divided into multiple columns (n columns), each column is called a "way." Each block of each row represents a data block associated with a corresponding tag array entry. Suppose the data array is divided into two ways. If for example data associated with two different sets of tag bits are always needed together, these two data sets are placed in the same row, each in a separate block. Consequently, if the index bits described above map to the same cache location (blocks), those two blocks will have identical index bits in the same index location for the two different cache ways. In cases where two data blocks with identical index bits as described above (i.e., map to the same index location in cache) and with different sets of tag bits are always needed together, these two data blocks are placed in the two different cache ways. For a hit/miss detection, both of the tag entries are compared and depending on whether there is a match it will be considered a hit or if not, then it will be considered a miss.

In each of these architectures, there may also be a single bit appended to the cache to indicate whether the data is valid for the combination of c bits and the tag bit.

Regardless of which architecture is used, caches have grown over the years in computing systems, which has seen an increase in energy consumption, particularly due to caches. Complementary metal oxide semiconductor (CMOS) based memories face challenges with technology scaling due to increased leakage and process variations. These challenges, coupled with an increased demand for on-chip memory, have led to an active exploration of alternative on-chip memory technologies.

One such alternative technology is spin transfer torque magnetic random access memory (STT-MRAM) which has gained significant interest in recent years as a potential post-CMOS memory technology. STT-MRAMs offer high density and near-zero leakage, making them promising candidates for on-chip memories. However, their overall energy efficiency is still limited by the energy required for spin transfer torque (STT) switching in writes and reliable single ended sensing during reads.

Several emerging applications that have fueled the demand for larger on-chip memories (including multimedia, recognition, data mining, search, and machine learning, among others) also exhibit intrinsic resilience to errors, i.e., the ability to produce results of acceptable quality even with approximations to their computations or data. Approximate computing exploits this characteristic of applications to derive energy or performance benefits using techniques at the software, architecture, and circuit levels. Most previous work in approximate computing focuses on processing or logic circuits. Previous efforts on approximate storage can be classified based on the level of the memory hierarchy that they target. Some focus on application-specific memory designs. A few efforts explore approximate cache architecture with CMOS memories, using techniques such as skipping cache loads on misses. However, in all these past works a substantial challenge remain based on energy usage of the cache.

Therefore, there is an unmet need for a novel architecture to reduce energy usage in cache memories, particularly in spintronic-based cache memories.

SUMMARY

An approximate cache system is disclosed. The system includes a quality aware cache controller (QACC) configured to receive address, data, and a read/write signal from a processor. The system also includes a cache. The cache includes a data array comprising one or more ways, each way having one or more bytes, and each byte having one or more bit groups. The cache also includes, a tag array comprising one or more ways each associated with the one or more ways of the data array. Furthermore, the system includes a quality table configured to receive addresses and a quality specification from the processor associated with each address and further configured to provide the quality specification for each address to the QACC.

A method to control cache based on approximation is disclosed. The method includes providing a quality aware cache controller (QACC) configured to receive address, data, and a read/write signal from a processor. The method also includes providing a cache. The cache includes a data array comprising one or more ways, each way having one or more bytes, and each byte having one or more bit groups. The cache also includes, a tag array comprising one or more ways each associated with the one or more ways of the data array. Furthermore, the method includes providing a quality table configured to receive addresses and a quality specification from the processor associated with each address and further configured to provide the quality specification for each address to the QACC.

DETAILED DESCRIPTION

Figure 1:
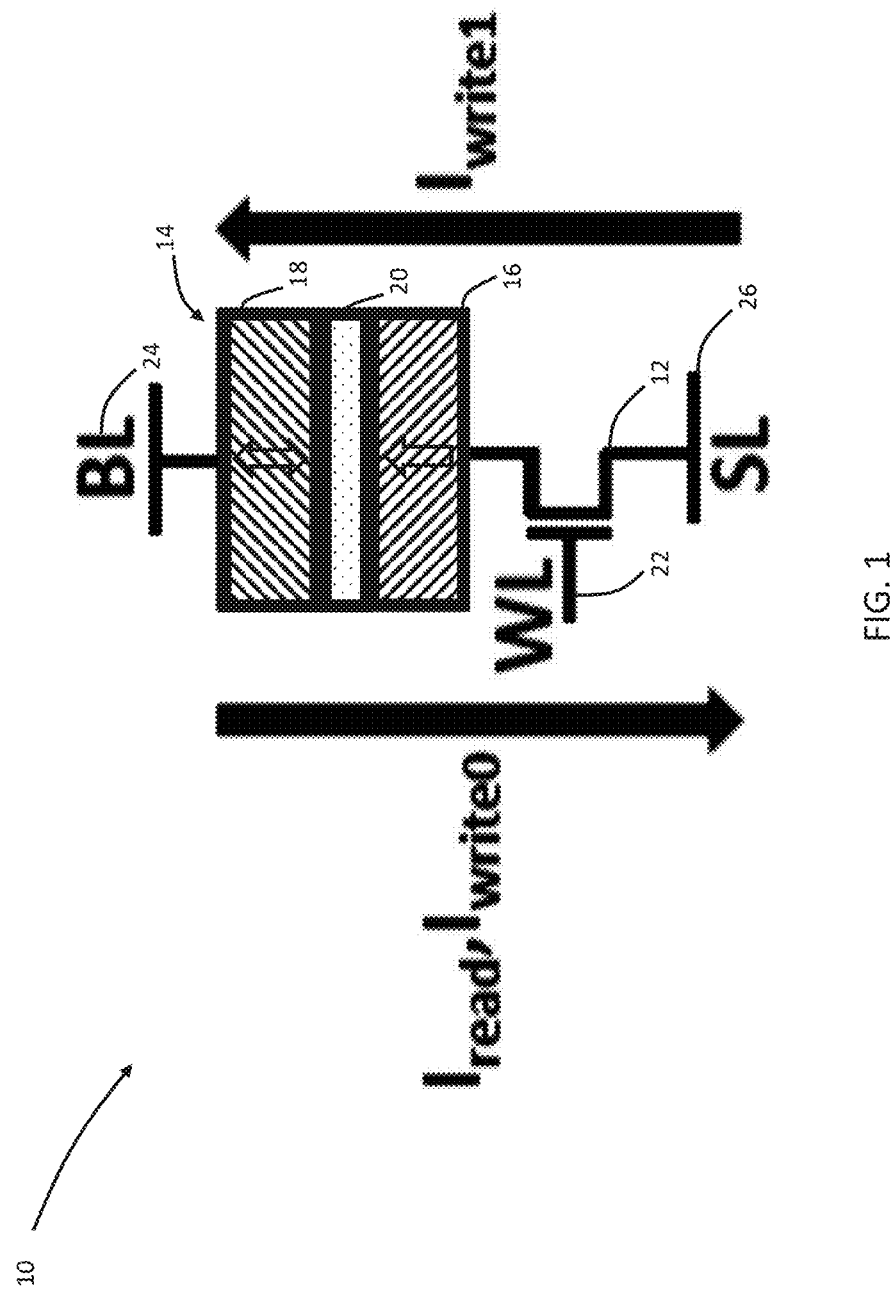
FIG. 1 is a schematic of a typical spin-torque transfer magnetic read access memory (STT-MRAM) cell.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

A novel architecture that reduces energy usage in cache memories is disclosed. This novel architecture can be applied to both CMOS-type cache structures as well as to spintronic cache structures. While the former type of cache memory is well understood in the art, the latter is much less understood. Referring to FIG. 1 a typical spin-torque transfer magnetic read access memory (STT-MRAM) cell 10 is shown. The STT-MRAM cell 10 includes an access transistor 12 and a magnetic tunnel junction (MTJ) stack 14. The MTJ Stack 14 is positioned between a high side bit line (BL) 24 and the access transistor 12 and includes a ferromagnetic pinned layer 16 (which has a fixed magnetic orientation) and a free layer 18 (whose orientation can be switched), separated by a tunneling oxide barrier 20. The access transistor is positioned between the MTJ stack 14 and a source line (SL) 26 and is controlled by a gate 22. The logic state stored in the bit-cell depends on the relative orientation between the free layer 18 and the pinned layer 16. According to one embodiment, parallel orientation represents "0" and antiparallel orientation represents "1". A read operation involves activating the gate 22 of the access transistor 12 identified as a wordline (WL) and applying a bias voltage (Vread) between the BL 24 and the SL 26. The resulting read current through the STT-MRAM cell 10 (Tread in FIG. 1) is compared against a global reference current to determine the logic state stored. A write operation is performed by passing a current greater than a critical switching current ($I_c$) of the MTJ stack 14 for a minimum switching duration. The current direction ($I_{write0}$, $I_{write1}$ in FIG. 1) differs based on the logic value to be written into the STT-MRAM cell 10. A read operation requires a small current (i.e., much smaller than the critical switching current) to be passed through the STT-MRAM cell 10. This read operation can be accomplished based on a voltage-based sensing scheme wherein a small known current is applied to the BL 24 and resistance across the STT-MRAM cell 10 is measured. A higher resistance represents a "1" where resistance is measured by comparing the voltage across the STT-MRAM cell 10 against a reference voltage Vref (a voltage lower than the voltage associated with the high resistance and higher than the voltage associated with the low resistance); or based on a current-based sensing wherein a small voltage is applied across the STT-MRAM cell 10 and the current through the STT-MRAM cell 10 is measured, where a large current represents a "0" and small current represents a "1".

Writes in STT-MRAM cell 10 are stochastic in nature, and the magnitude and duration of the write current determines the write failure rate. Besides write failures, the STT-MRAM cell 10 may also suffer from read decision failures, where the data stored in a bit-cell is incorrectly read due to process variations, and read disturb failures where a read operation accidentally writes into the cell. Another key design metric of the STT-MRAM cell 10 is the retention time, which is the duration for which the data stored in an idle bit-cell is retained. Lowering the retention time makes switching the MTJ easier, since it decreases Ic. However, it also makes the bit-cell more prone to retention failures due to thermal disturbances.

Read operations as well as write operations require energy. For example, in one embodiment, read operation may require 0.45 pJ/bit, while write operations may require 2.25 pJ/bit. Given the size of cache memory, frequent reads and writes can amount to a significant overall energy requirement. Additionally, refreshes are needed when the retention time for the data is lowered, i.e., when data is placed in low retention ways. The energy requirements of these operations coupled with the knowledge that for various applications a certain amount of error and uncertainty is acceptable, has led to an innovative approach rooted in hardware to manage energy requirements via different approximation approaches. These approximation techniques include: 1) Approximation through partial reads/writes, where reads (or writes) to selected least significant bits are ignored; 2) Approximation through lower read currents, wherein a lower read current is used for sensing, thereby trading off decision failures for read energy benefits; 3) Approximation through skipped writes altogether, wherein writes to a cache block are skipped at run-time if they are similar to its current contents; 4) Approximations through lower write duration or write current, wherein writes are performed for a smaller duration or with a smaller current, resulting in an increased probability of write failures; and 5) Approximations through skipped refreshes, wherein refresh operations to the low retention blocks are selectively skipped. Hardware management of these approximation techniques are separately discussed herein below.

Figure 2A:
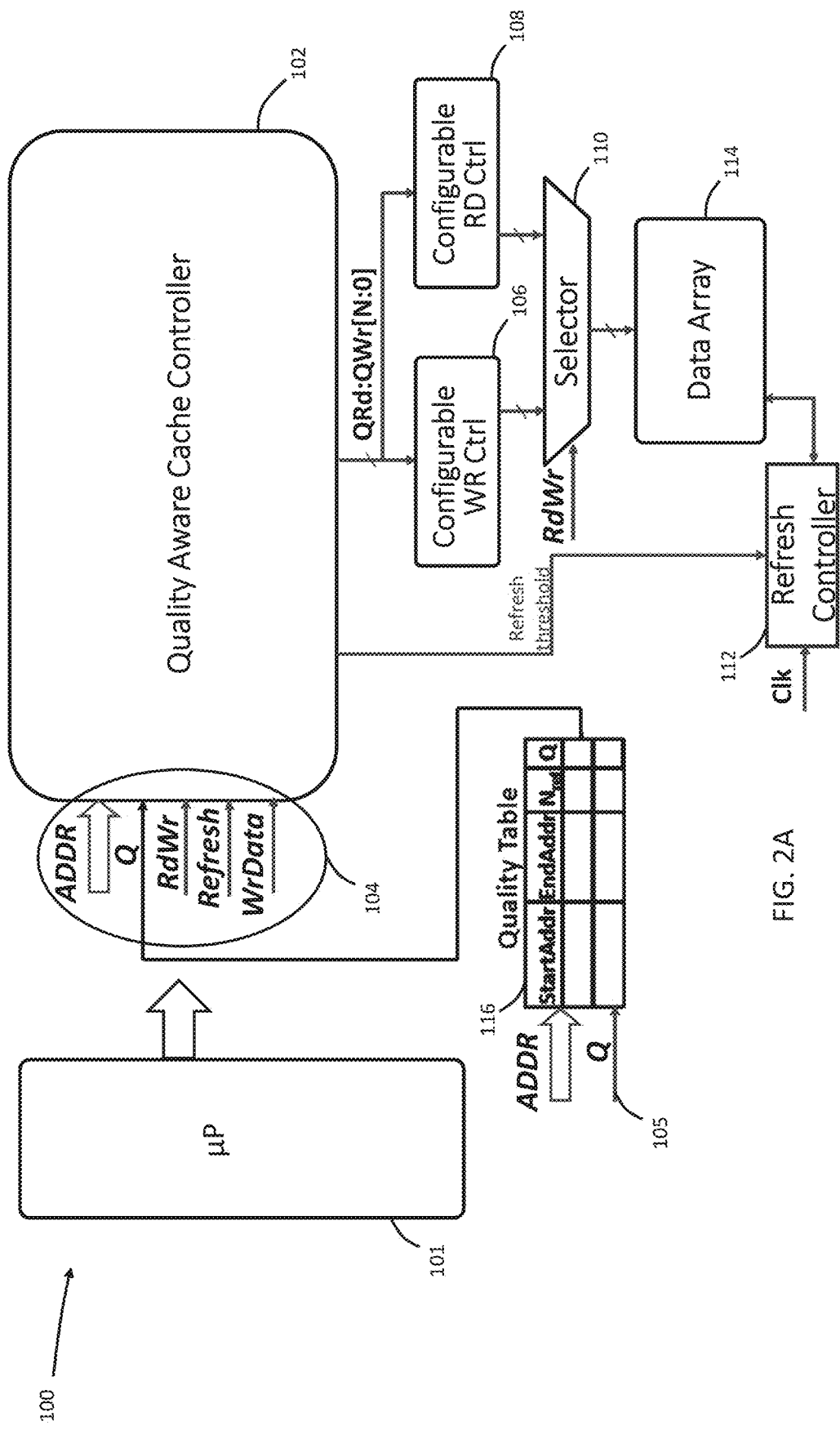
FIG. 2A is a schematic of a high-level diagram of a Spintronic Approximate Cache (STAxCache) system including a quality aware cache controller (QACC), according to the present disclosure.
Figure 2B:
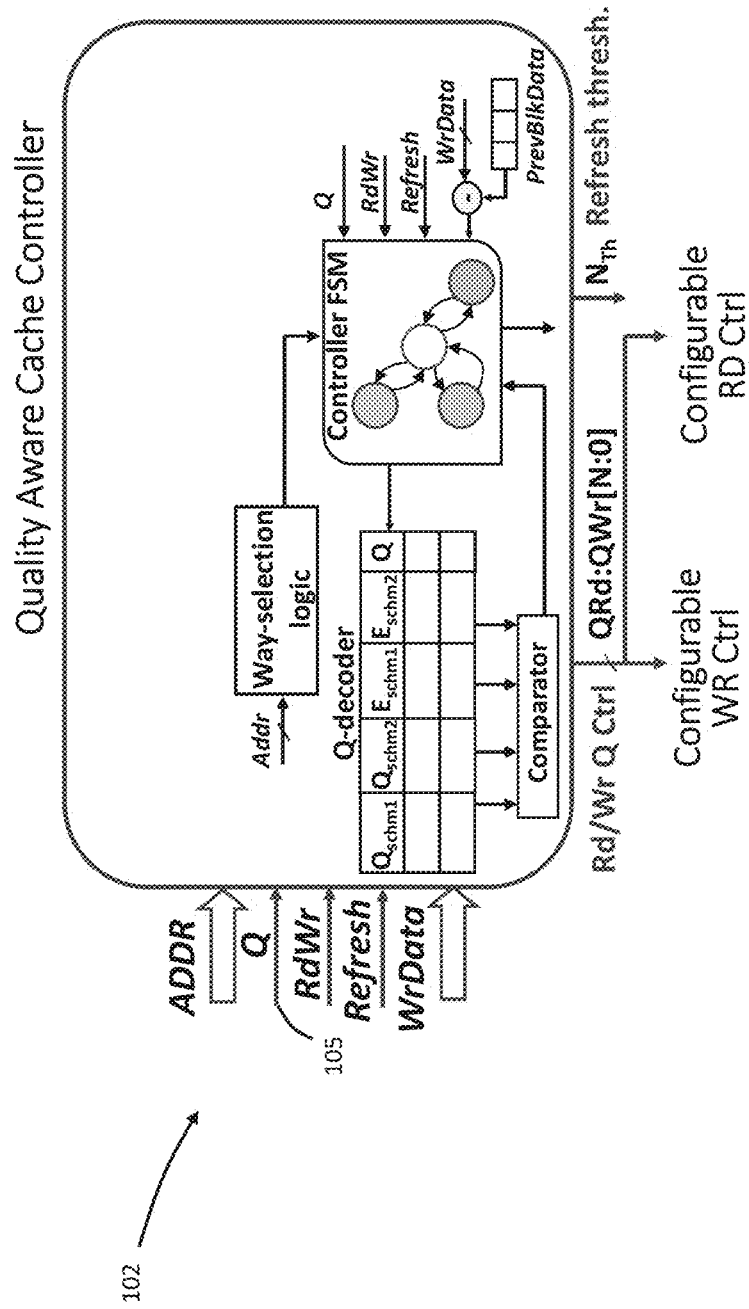
FIG. 2B, is a high-level schematic of the QACC of FIG. 2A.
Figure 9:
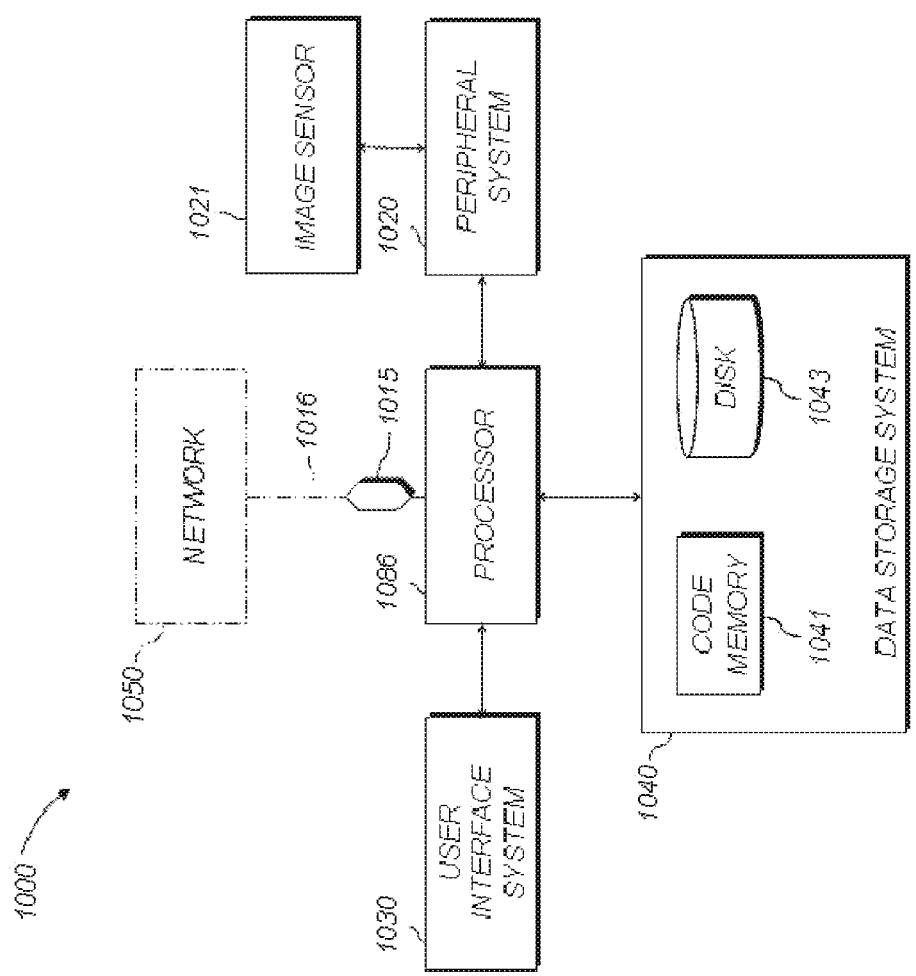
FIG. 9 is a high-level diagram showing components of an exemplary data-processing system, according to the present disclosure.

Referring to FIG. 2A, a high-level diagram of a STAx-Cache system 100 (STAxCache refers to (Spintronic Approximate Cache)) associated with the hardware components of the present disclosure is depicted. The STAxCache system 100 includes a microprocessor (or processor or μP) 101 and quality aware cache controller (QACC) 102 with inputs 104 provided by the processor 101 (except for Q which comes from the quality table 116 as a pass through input or directly from the processor 101, as further described below). The QACC 102 and its internal structures are shown in FIG. 2B, as described below. One exemplary embodiment of the processor 101 and its related circuitry is shown in FIG. 9, identified as processor 1086, further described below. The inputs 104 represent the usual inputs to a cache controller (e.g., an address bus, a RdWr line representing whether the cache is being written to or read from, a refresh line representing a request by the processor 101 in cases where a cache is designed with low retention ways that require a refresh operation, as further described below, and a data bus WrData representing data to be written to the cache). However, one difference between inputs 104 and the usual inputs to a cache controller is the quality input Q. For each range of addresses, processor 101 via a predetermined schedule or through dynamic determination specifies the quality specification for that range of address. During a programming phase, the processor 101 provides address ranges to a quality table block 116 and for each address range the processor 101 provides a quality specification via line(s) Q 105.

The input Q is also used as an input to a finite state machine (FSM) inside the QACC 102. The FSM (not shown) of the QACC 102 is similar to a regular cache controller FSM with a few additional states in the machine to trigger certain actions, e.g. to determine if the data can be skipped for writing, whether there is a need to initiate a read of the cache location before writing to the location, as further described below.

The QACC 102 selectively determines which combination of the 5 approximation techniques described above would best produce an acceptable quality while minimizing cache energy for read/write/refresh operations. In doing so, the QACC 102 provides special quality-based control signals (identified as QRd:QWr[N:0]) to two blocks not seen in a typical cache controller system. The two new blocks are configurable WR Ctrl (CWRC) 106 and configurable RD Ctrl (CRDC) 108, both described in more detail below. Depending on the RdWr select line, a selector block 110 provides suitable driver signals that regulates the read/write quality of the corresponding data block in the data array 114 using appropriate read driver signals from CRDC 108 or write driver signals from CWRC 106. Note that, read driver and write driver circuits are part of the peripheral circuits of the data array 114 which are used to perform the read/write functions as described earlier. The data array 114 operates in a novel manner somewhat differently than a typical data array discussed in the background section of the present disclosure. The data array 114 is a quality-configurable data array that is capable of performing read or write operations at various levels of accuracy and energy depending on the application's requirements, and a tag array that is not subject to approximations. The quality configurability of the data array 114 can be achieved by a quality configurable circuit embedded within the data array 114 or by circuits outside as shown in FIG. 2A. The data array 114 is further composed of heterogeneous cache ways with varying retention levels (ways with lower retention time offer more energy-efficient writes). As part of the quality approximation, the QACC 102 determines which of the data ways are considered low retention type and which are considered high retention type. That information is provided to another novel block refresh controller (RC) 112 which is responsible for refreshing data in the data array 114 based on a refresh threshold input provided by the QACC 102.

Each entry in the quality table 116 contains a memory address range and the desired quality for accesses to addresses within the range, e.g., permissible magnitude of error that may be incurred when a location in the specified range is accessed. Note that the permissible error magnitude metric provided here is one embodiment of quality for access and may be replaced with other metrics such as error rate, average error, etc. On each cache access, the cache block address with the address ranges present in the table are compared. If there is a match, the corresponding quality for reading (or writing) the block is utilized. The quality table is populated during an initial programming phase, or dynamically, by populating columns with address ranges in the form of Start Addr and End Addr, a quality column, as well as an $N_{ref}$ column. The latter is a counter such that for each entry the counter tracks the number of refreshes skipped (one of the approximation techniques discussed below) for a given address range on each update cycle. As discussed above, in operation, each cache address that is to be accessed (read or write operation) is compared with the address range in the quality table. If there is a match, then the quality value associated with that address range will be used in that operation.

It should be noted that the typical data and address buses and multiplexer(s) that control flow of data to and from the data array are not shown, as those are known to a person having ordinary skill in the art.

In the next few section, each approximation approach mentioned above will be discussed. The first approximation approached discussed is partial reads. In this approach, one or more least significant bits (LSBs) of the address is ignored while reading each data in a cache block. Unlike SRAM, STT-MRAM does not suffer from the half-select problem; therefore, bit lines and source lines corresponding to the LSBs may be gated to achieve energy savings. The LSBs are simply set to a constant value (ALL-0s, ALL-1s or any other constant value or alternate 0s and 1s) in the value returned from the cache. The QACC 102 tracks the error (either using statistical averages or worst-case) and the QACC 102 ensures that it is permissible for the specified block-level constraint. The next approach is approximation via lower read currents. As discussed above, STT-MRAM bit-cells naturally provide energy vs. quality trade-offs when a current smaller than the nominal current ($I_{read}$) is passed through the bit-cell during reads. Leveraging this attribute, some of the bits in a cache block can be read with a lower $I_{read}$, leading to increased probability of read failures for the corresponding bits. This is performed in a bit-significance driven manner by dividing each data in the cache block into bit groups, and associating a lower read failure probability for the more significant bit groups. This approach enables a fine-grained control over the errors introduced during reads.

The next approach for approximation is via skipped or partial writes. In this scheme, the difference in magnitude of the data in the incoming write block with the previously stored values at the same location are compared to determine if the write to the cache location can be skipped based on whether that would violate the cache block-level quality constraint. If it does not, the write is skipped and the value of the memory is retained, thereby saving considerable energy. However, if the write operation cannot be skipped, a similar approach as approximate partial reads can be adopted wherein few of the LSBs of a data are not written (the number of ignored bits is determined by the quality constraint).

The next approach in approximation is via lower write duration or lower write current. Similar to the situation in lower read current approximation method, writes in STT-MRAM bit-cells can take advantage of approximations wherein energy benefits can be obtained by lowering the write current or write duration at the cost of write failures. Consequently, a bit-significance driven approach similar to the approach for lower read currents approximation can be utilized. Specifically, a higher write failure probability can be introduced to the least significant bit group, and progressively associate decreasing failure probabilities for the higher significance groups within each data of the block, by suitably modulating the write duration.

The last approximation approach is via skipped refreshes. Lowering the retention time in an STT-MRAM bit-cell reduces the write energy at the cost of increased retention failures. Since most applications contain a mix of resilient and sensitive data, simply reducing the retention time for the entire cache is not acceptable. Therefore, a hybrid data array that comprises of both high retention and low retention ways, as discussed with reference to FIG. 2A, is discussed below. While the present disclosure provides an exemplary retention scheme of two levels, higher degrees of heterogeneity is within the scope of this disclosure.

To appreciate this novel approximation via skipped refreshes, requirements for refreshes is first described. Cache blocks stored in the low retention ways are subject to a significant increase in the probability of errors beyond the retention time ($T_{Ret}$) caused by the exponential nature of retention failures. Simply allowing retention errors is not always acceptable. While the STAxCache 100 preferentially allocates cache blocks with lower quality requirements to the low retention ways, data with very tight quality constraints (or data that cannot be approximated) may also be allocated to the low retention ways to ensure high cache utilization and low misses. Moreover, the lifetimes of cache blocks in low retention ways may vary considerably within and across applications. Thus, the approach according to the present disclosure is based on the need for periodic refresh operations, particularly when the lifetimes of the blocks are closer to (or exceed) $T_{Ret}$. Refreshing all the valid cache blocks in the low retention ways after each $T_{Ret}$ would ensure substantially no retention errors, but will lead to a significant number of energy-costly refreshes. The STAxCache 100 of the present disclosure addresses this issue by skipping refreshes for cache blocks that have been written due to a store instruction in the recent past. To enable this refresh skipping strategy, The STAxCache 100 extends the tag array with only one retention bit per cache block to track the blocks stored in the low retention ways that have been written to or "self-refreshed" since the last refresh operation. An example to demonstrate this refresh mechanism is helpful. Suppose the STAxCache 100 includes a 2-way set associative cache that includes a high retention way and a low retention way. To keep track of refreshes, one retention bit per block is needed. Further, suppose at T=0, two cache blocks—B0 and B1—are inserted in the low retention way. At T=$T_{Ret}$/2, the retention bits associated with all the cache blocks are checked. In case the retention bit had previously been set to logic '0', it will be updated to logic '1', indicating that the block is due for a refresh operation in the next update cycle, i.e., T=$T_{Ret}$ for blocks B0 and B1. Next, suppose a write operation is performed on B0 between T=$T_{Ret}$/2 and T=$T_{Ret}$. In this case, the retention bit is reset to logic '0'. Hence, B0 no longer requires a refresh operation in the following update cycle. On the other hand, if the retention bit is set to '1', a refresh operation for B1 will be performed at T=$T_{Ret}$, and the retention bit is reset to '0'.

However, even by exploiting the self-refreshes as described above to lower the refresh overheads, the energy consumed by the refresh operations still constitute a significant fraction of the total cache energy. In order to minimize the refresh energy further, a scheme to skip refreshes for blocks that are amenable to approximations, is hereby introduced. When refreshes are skipped based on approximation, it will be important to have control over the retention errors introduced in the stored blocks as a result of the skipped refreshes. Towards this end, the quality table 116 also includes an additional counter ($N_{Ref}$); each $N_{Ref}$ entry tracks the number of refreshes skipped for a given address range on each update cycle. Similar to the previous example, suppose at T=$T_{Ret}$ and T=2$T_{Ret}$, the addresses corresponding to B0 and B1 which are due for refresh (retention bits are set to '1'), are compared against the address ranges in the quality table. In case of a matching entry (suppose B0 is not matched but B1 is matched), the corresponding $N_{Ref}$ is compared to a refresh threshold ($N_{Th}$) that is determined from the corresponding block-level quality constraint obtained from the quality table 116 for a given Q as further described below with reference to FIG. 8. If $N_{Ref}$ exceeds (or equals) Nm, refreshes are carried out for each of the low retention blocks contained in the address range (B1 at T=2$T_{Ret}$), else those refreshes are skipped (B1 at T=$T_{Ret}$ and T=3$T_{Ret}$/2) and $N_{Ref}$ is incremented by 1. If a matching range does not exist in the table (e.g., B0 is not matched in the quality table 116), the refresh operations are performed for those blocks (e.g., B0) at T=$T_{Ret}$ and T=2$T_{Ret}$.

As alluded to above, the QACC 102 of the STAxCache 100 is further configured to control the data array 114 so that it can be divided into low and high retention ways. The QACC 102 receives the control input Q 105 that represents the desired quality for each cache access. Within the QACC 102, a quality decoder receives the quality input Q 105 and the read/write control signal (RdWr) as inputs and generates values of quality knobs (Q[N−1:N−R], ..., Q[R−1:0]) for each bitgroup within the data block as discussed above (a bitgroup comprises R bits and N is the total number of bits in the data block). The QACC 102 also generates $N_{th}$ (i.e., refresh threshold) for the refresh controller 112 based on the Q input for any refresh operation, which is indicated using the Refresh control signal. Since the energy vs. quality trade-offs widely vary across the different schemes, a systematic approach is utilized to obtain these knobs such that the energy savings are maximized for a given quality bound.

Figure 3:
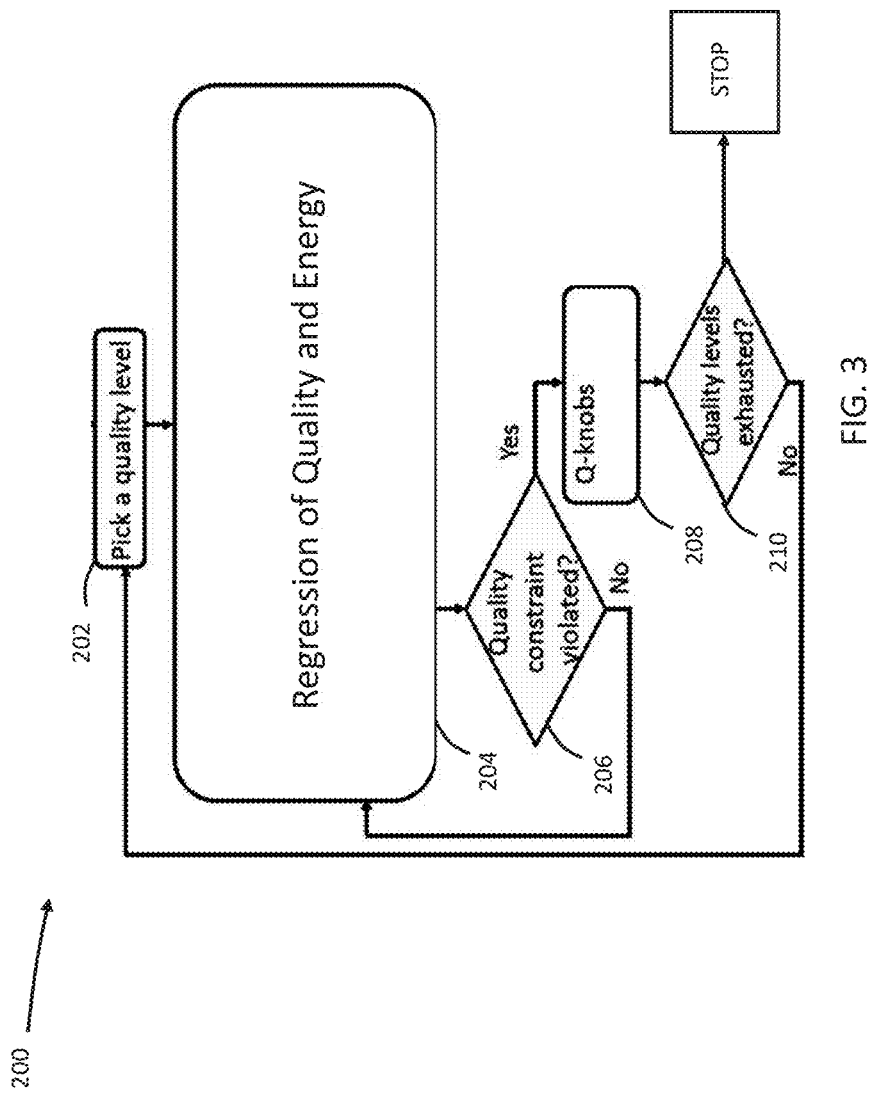
FIG. 3 is a schematic for a set of design-time configurations for varying quality knobs for read quality modulation approaches, according to the present disclosure.

Referring to FIG. 3, a design-time configuration is depicted for varying quality knobs for read quality modulation approaches. The block diagram 200 (occurring at QACC 102 in conjunction with CRDC 108, see FIG. 2A) provides the steps in making the quality choices based on the two read quality modulation options (i.e., approximation through partial reads and lower read currents) as well as no approximation option. At design time, different quality vs. energy configurations of these three schemes, are evaluated to determine which approach can provide the best energy vs. quality tradeoff. Q is initially provided by the processor 101, block 202. There exist several configurations that achieve the same output quality (Q) based on the choice of these three schemes, although with substantially different energies. For a given Q goal, there are multiple ways to achieve Q but all of them consume different energy. The goal of the CRDC 108 is to find the Q with the lowest energy (e.g., by a regression methodology, known to a person having ordinary skill in the art). In each regression iteration (block 204), the STAxCache 100 ranks the read schemes based on the additional energy savings obtained by approximating a group of R bits (i.e., each bitgroup) for each data and the expected error introduced in the process by determining whether quality constraint is violated (decision block 206). Next, the STAxCache 100 chooses the scheme for the bit group with the highest ratio of energy benefits and expected error, and proceeds to the next iteration until the block-level quality constraint is violated, block 206, at which point quality characteristics for the data are determined, blocks 208. The above steps are then repeated for each quality level supported by the cache until all quality levels are accounted for, block 210. The operations shown in the block diagram 200 are performed at design time for each block of a representative subset of data blocks, which reflects the actual data blocks encountered in cache during execution of error-tolerant applications, thereby representing the quality knobs that need to be provided for reading each data block at runtime.

Figure 4:
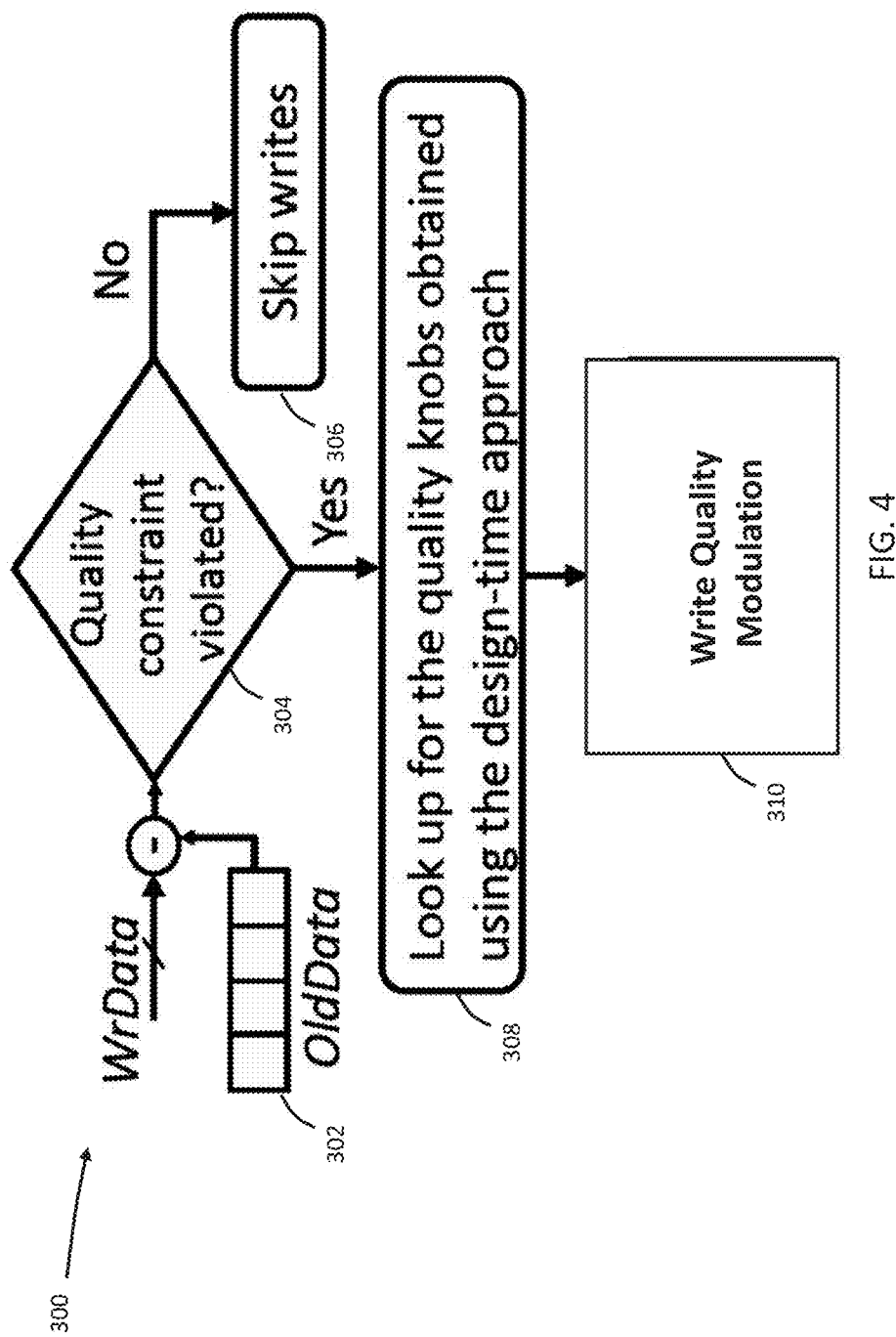
FIG. 4 is a schematic for a set of design-time configurations and a run-time configuration for varying quality knobs for write quality modulation approaches, according to the present disclosure.

Referring to FIG. 4, a hybrid design-time and run-time block diagram 300 (occurring at QACC 102 in conjunction with CWRC 106, see FIG. 2A) is depicted to show how quality selection for write quality modulation is carried out, according to the present disclosure. When a data-write operation is requested, the CWRC 106 compares data already stored, identified as oldData 302, with new data to be written. This comparison is identified as the decision block 304. If quality constraint is not violated, then the CWRC 106 skips the write operation. This check is performed dynamically. If the comparison violates the quality constraints, then CWRC 106 uses quality knobs determined in the design-time, similar to FIG. 3, as identified in block 308. Based on the quality selection determined at design-time, write-quality modulation occurs (i.e., partial writes based on skipping writes of a few of the LSBs of data, or based on reducing write duration), as shown in block 310.

Figure 5:
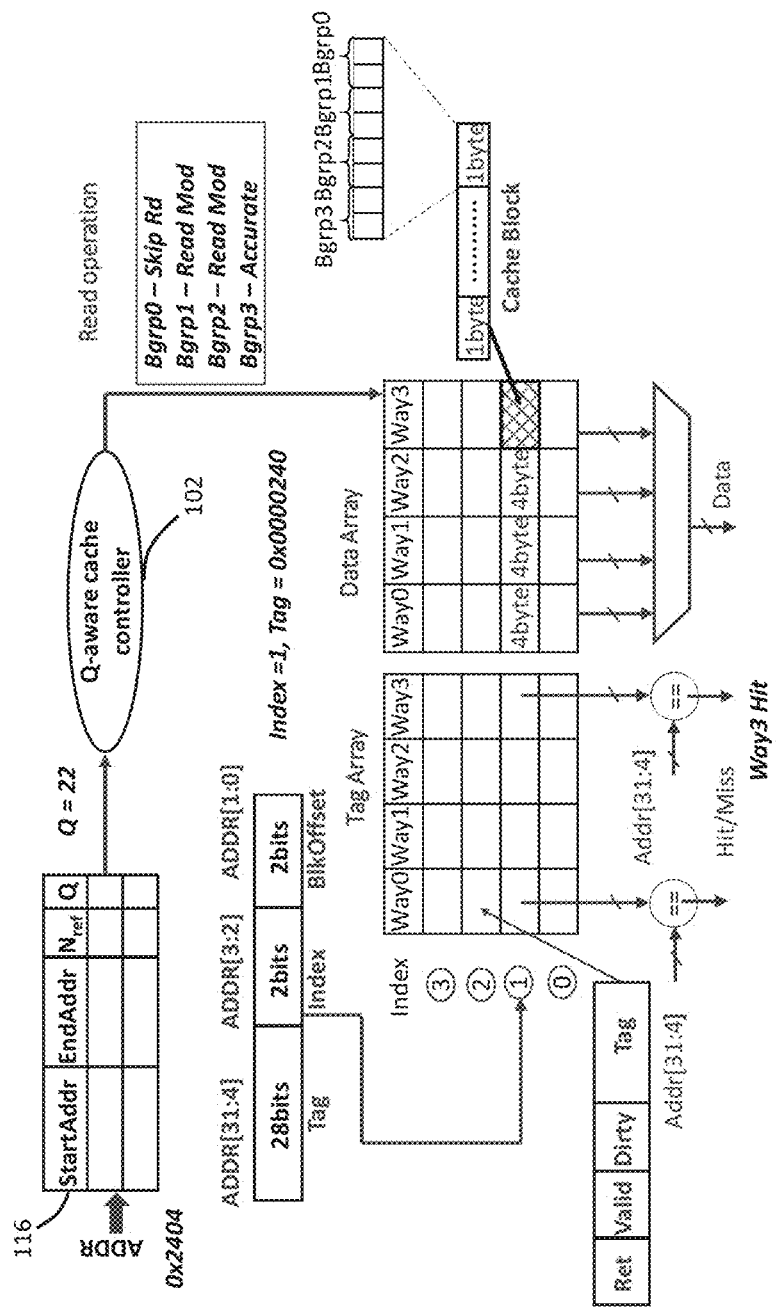
FIG. 5 is an exemplary schematic of how quality controls are managed, according to the present disclosure.

An example on how the quality controls are managed is provided below, with reference to FIGS. 5-8. Referring to FIG. 5, suppose after the quality table 116 is populated, the processor 101 (See FIG. 2A) wants to read data from a 32-bit address 0x2404, somewhere in the range of StartAddr and EndAddr. Suppose the data array and accordingly the tag array each have four ways (Way0, Way1, Way2, Way3), and based on the size of data block in each way, i.e., 4 byte in this case, and with a byte addressable memory, 2 bits (ADDR[1:0]) are dedicated as block offset (identified in the example of FIG. 5 as BlkOffset). Next, suppose there are only 4 rows in each way with each block being 4 bytes of data (shown as index 0, 1, 2, 3), and therefore 2 bits (ADDR[3:2]) are dedicated as index bits. The remainder 28 bits of the address (ADDR[31:4]) are dedicated to the tag. In this example, the tag becomes 0x0000240. In each Way in the tag array, the contents include a retention bit (described above, and further below), a valid bit indicating data in the data array is valid for the tag (i.e., the processor 101 has previously written data to the data array), a dirty bit which is a status bit in a write-back cache which maintains status to indicate whether the cache content has been modified (known to a person having ordinary skill in the art), and the tag. After having determined the index, Way0, Way1, Way2, and Way3 are checked all in parallel by comparing with tag bits stored for each to determine which way is a hit. In this case a hit in Way 3 is observed. For this address, suppose the stored quality is 22. The quality table 116 provides the desired Q (22) to the quality aware cache controller 102. Further suppose the address bus is a 32-bit bus (where the cache is byte addressable, i.e., each byte can be addressed). Based on the index bits where the way hit determines which way to check for data and the tag bits determine the hit, a hit is established for Way3 in index 1. Next, as mentioned above each Way in the data array includes 4 bytes, and each byte is represented by 4 bit groups Bgrp3, Bgrp2, Bgrp1, and Bgrp0. Based on the design time operations described above with reference to FIG. 3, Bgrp0-Bgrp3 are designated as skip read (i.e., partial read), read current modulation, read current modulation, and accurate (i.e., no approximation), respectively. The CRDC 108 receives information related to read current modulation. The QACC 102 informs CRDC 108 the extent to which the current needs to be modulated (in this case there is only one mode; however, for a general case, there may be multiple degrees of current modulation, in which case the QACC 102 encodes those modes as 00, 01, etc., according to one embodiment of the present disclosure and presents those modes to the CRDC 108, and the CRDC 108 will interpret each of those modes as representing a value for current).

Figure 6:
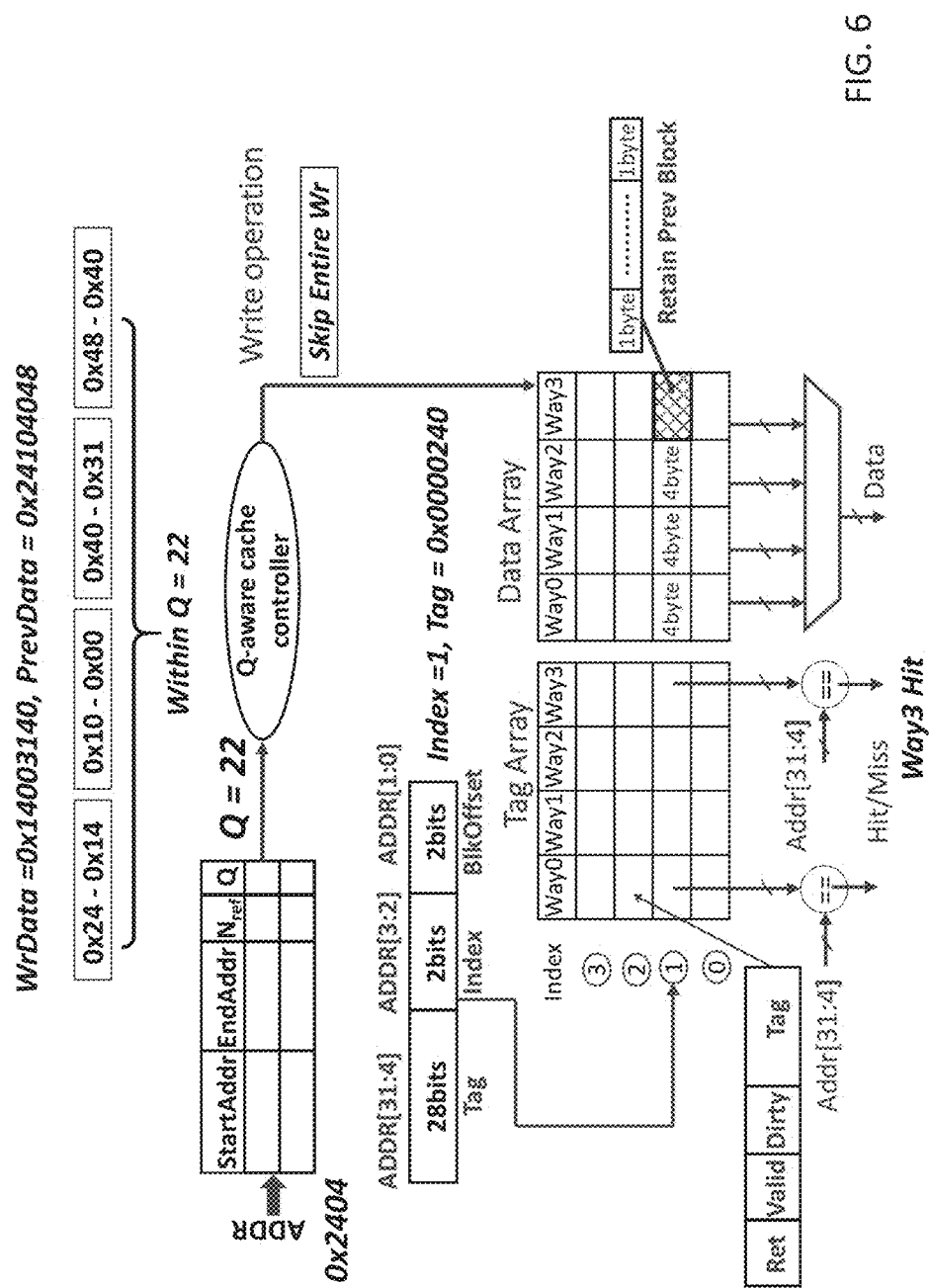
FIG. 6 is another exemplary schematic of how quality controls are managed, according to the present disclosure.

Referring to FIG. 6, an example of the write operation is provided. In this example, the same address is used, therefore, the data to be written is in index 1. Hit/miss detection logic makes a hit on Way3 and the quality is 22. Suppose the new data to be written (identified in FIG. 6 as WrData) is 0x14003140 and the old data (identified in FIG. 6 as PrevData) is 0x24104048. In an AND operation each byte of the old data and the new data are compared to determine if the difference in each byte is less than 22. In this example, the first byte represents a hexadecimal difference of 0x10; the second byte represents a hexadecimal difference of 0x10; the third byte represents a hexadecimal difference of 0x0f; and the fourth byte represents a hexadecimal difference of 0x08. Since each of these differences (i.e., the AND operation) is less than 22, the entire write may be skipped. This determination is made dynamically at run time. Therefore, the data in Way3 is retained from the old data (i.e., 0x2410404) instead of writing the new data (0x14003140).

Figure 7:
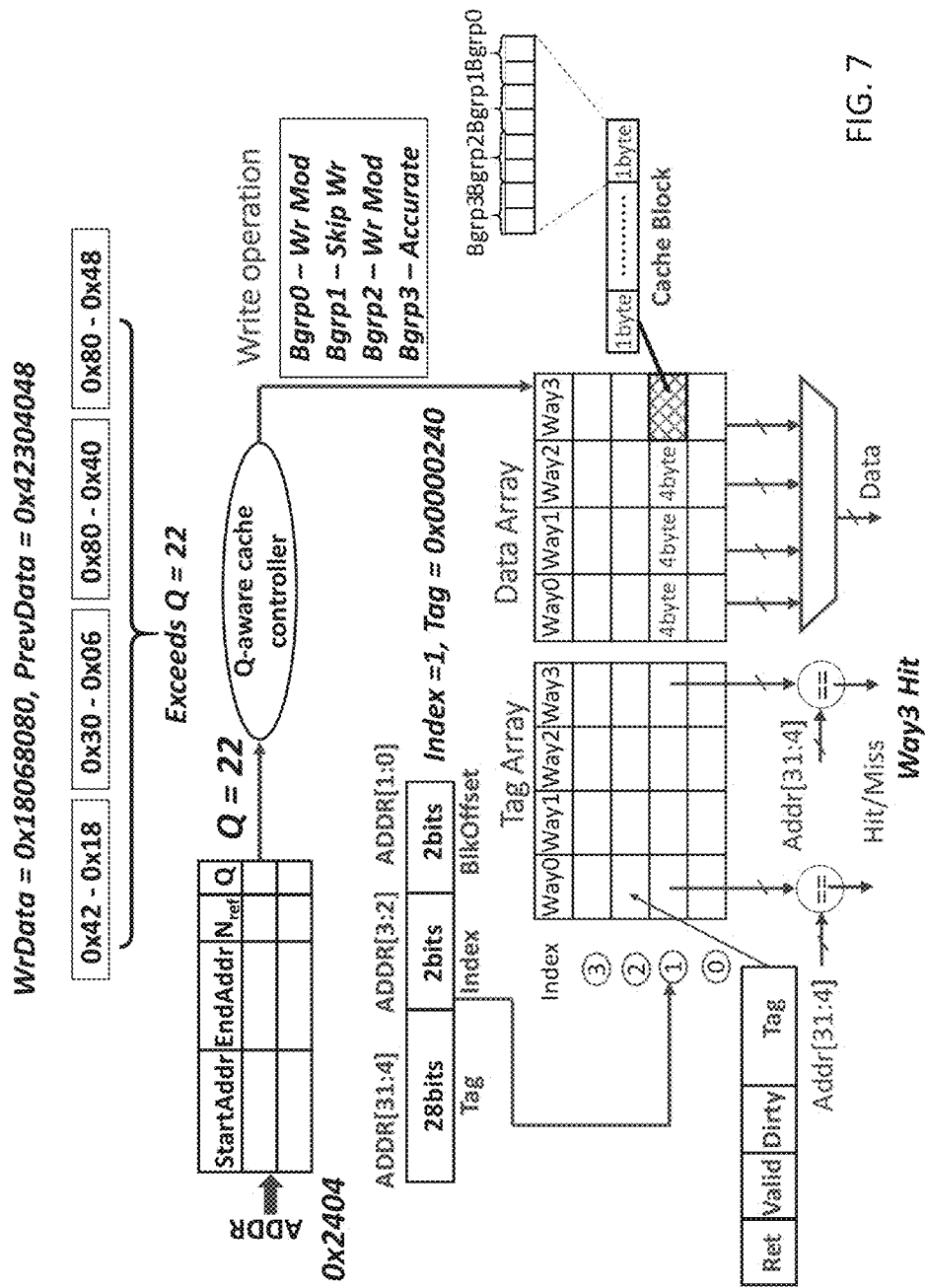
FIG. 7 is another exemplary schematic of how quality controls are managed, according to the present disclosure.

Referring to FIG. 7, another example of the write operation is provided. In this example, the same address is used, therefore, the data to be written is in index 1. Hit/miss detection logic determines a hit on Way3 and the quality is 22. Suppose the new data to be written (identified in FIG. 7 as WrData) is 0x18068080 and the old data (identified in FIG. 7 as PrevData) is 0x42304048. In an AND operation each byte of the old data and the new data are compared to determine if the difference in each byte is less than 22. In this example, the first byte represents a hexadecimal difference of 0x2a; the second byte represents a hexadecimal difference of 0x2a; the third byte represents a hexadecimal difference of 0x40; and the fourth byte represents a hexadecimal difference of 0x38. Since at least one of these differences (i.e., the AND operation) is greater than 22, the entire write may not be skipped. This determination is made dynamically at run time. Since the entire write cannot be skipped, the decision on how to modulate the data is relegated to the design time determination for each bit group. In this example, based on the design time operations described above with reference to FIGS. 3 and 4, Bgrp0-Bgrp3 are designated as write duration modulation, partial write, write duration modulation, and accurate (i.e., no approximation), respectively. The CWRC 106 receives information related to write duration or current modulation. The QACC 102 informs CWRC 106 the extent to which the write duration or write current needs to be modulated (in this case there is only one mode; however, for a general case, there may be multiple degrees of write duration or current modulation, in which case the QACC 102 encodes those modes as 00, 01, etc., according to one embodiment of the present disclosure and presents those modes to the CWRC 106, and the CWRC 106 will interpret each of those modes as representing a value for write duration or write current).

Figure 8:
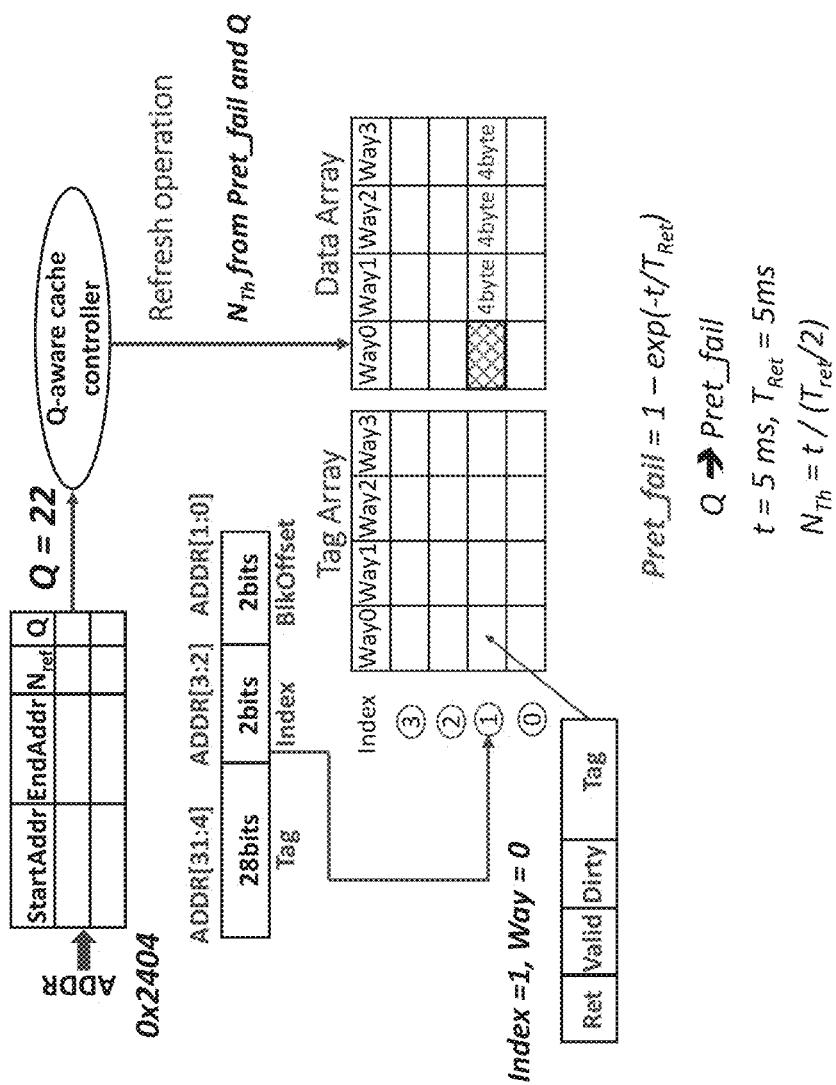
FIG. 8 is another exemplary schematic of how quality controls are managed, according to the present disclosure.

Next, referring to FIG. 8, an example of the refresh operation is provided. Suppose Way0 and Way1 are low retention ways. In this example, the same address is used, therefore, the data in connection with the refresh operation is associated with index 1, Way0 with a quality of 22. The quality table 116 provides the desired Q (22) to the quality aware cache controller 102. The quality aware cache controller 102 calculates a threshold for refreshes based on probability of bit failures due to absence of refreshes. The probability is calculated based on the following relationship:

$$Pret\_fail = 1 - \exp(-t/T_{Ret}),$$

where $T_{Ret}$ is the time period within which refreshing bits would ensure no retention errors (also termed as retention time discussed above), and Pret_fail is the probability of bit failures which provides retention error probability over time. The error probability gives the expected error which can be tolerated or incurred in the cache block, and hence the quality Q with which the block can be accessed. $N_{Th}$, which is the threshold of skipping refreshes before data corruption can occur, is determined from Pret_fail and Q based on solving for a Pret_fail using the Q requirement. The Pret_fail is used to compute t, which is compared with $T_{Ret}$ to obtain $N_{th}$ based on the following relationship:

$$N_{Th} = t/(T_{ret}/2)$$

Once, $N_{Th}$ is known, the Refresh Controller 112 can approximate refresh operations as described above. Note that the above equations are only exemplary, and may be replaced with any mathematical functions that are appropriate for the memory technology used to realize the data array.

Referring to FIG. 9, a high-level diagram showing the components of an exemplary data-processing system 1000 for analyzing data and performing other analyses described herein, and related components. The system includes a processor 1086, a peripheral system 1020, a user interface system 1030, and a data storage system 1040. The peripheral system 1020, the user interface system 1030 and the data storage system 1040 are communicatively connected to the processor 1086. Processor 1086 can be communicatively connected to network 1050 (shown in phantom), e.g., the Internet or a leased line, as discussed below. The imaging described in the present disclosure may be obtained using imaging sensors 1021 and/or displayed using display units (included in user interface system 1030) which can each include one or more of systems 1086, 1020, 1030, 1040, and can each connect to one or more network(s) 1050. Processor 1086, and other processing devices described herein, can each include one or more microprocessors, microcontrollers, field-programmable gate arrays (FPGAs), application-specific integrated circuits (ASICs), programmable logic devices (PLDs), programmable logic arrays (PLAs), programmable array logic devices (PALs), or digital signal processors (DSPs).

Processor 1086 can implement processes of various aspects described herein. Processor 1086 can be or include one or more device(s) for automatically operating on data, e.g., a central processing unit (CPU), microcontroller (MCU), desktop computer, laptop computer, mainframe computer, personal digital assistant, digital camera, cellular phone, smartphone, or any other device for processing data, managing data, or handling data, whether implemented with electrical, magnetic, optical, biological components, or otherwise. Processor 1086 can include Harvard-architecture components, modified-Harvard-architecture components, or Von-Neumann-architecture components.

The phrase "communicatively connected" includes any type of connection, wired or wireless, for communicating data between devices or processors. These devices or processors can be located in physical proximity or not. For example, subsystems such as peripheral system 1020, user interface system 1030, and data storage system 1040 are shown separately from the data processing system 1086 but can be stored completely or partially within the data processing system 1086.

The peripheral system 1020 can include one or more devices configured to provide digital content records to the processor 1086. For example, the peripheral system 1020 can include digital still cameras, digital video cameras, cellular phones, or other data processors. The processor 1086, upon receipt of digital content records from a device in the peripheral system 1020, can store such digital content records in the data storage system 1040.

The user interface system 1030 can include a mouse, a keyboard, another computer (connected, e.g., via a network or a null-modem cable), or any device or combination of devices from which data is input to the processor 1086. The user interface system 1030 also can include a display device, a processor-accessible memory, or any device or combination of devices to which data is output by the processor 1086. The user interface system 1030 and the data storage system 1040 can share a processor-accessible memory.

In various aspects, processor 1086 includes or is connected to communication interface 1015 that is coupled via network link 1016 (shown in phantom) to network 1050. For example, communication interface 1015 can include an integrated services digital network (ISDN) terminal adapter or a modem to communicate data via a telephone line; a network interface to communicate data via a local-area network (LAN), e.g., an Ethernet LAN, or wide-area network (WAN); or a radio to communicate data via a wireless link, e.g., WiFi or GSM. Communication interface 1015 sends and receives electrical, electromagnetic or optical signals that carry digital or analog data streams representing various types of information across network link 1016 to network 1050. Network link 1016 can be connected to network 1050 via a switch, gateway, hub, router, or other networking device.

Processor 1086 can send messages and receive data, including program code, through network 1050, network link 1016 and communication interface 1015. For example, a server can store requested code for an application program (e.g., a JAVA applet) on a tangible non-volatile computer-readable storage medium to which it is connected. The server can retrieve the code from the medium and transmit it through network 1050 to communication interface 1015. The received code can be executed by processor 1086 as it is received, or stored in data storage system 1040 for later execution.

Data storage system 1040 can include or be communicatively connected with one or more processor-accessible memories configured to store information. The memories can be, e.g., within a chassis or as parts of a distributed system. The phrase "processor-accessible memory" is intended to include any data storage device to or from which processor 1086 can transfer data (using appropriate components of peripheral system 1020), whether volatile or nonvolatile; removable or fixed; electronic, magnetic, optical, chemical, mechanical, or otherwise. Exemplary processor-accessible memories include but are not limited to: registers, floppy disks, hard disks, tapes, bar codes, Compact Discs, DVDs, read-only memories (ROM), erasable programmable read-only memories (EPROM, EEPROM, or Flash), and random-access memories (RAMs). One of the processor-accessible memories in the data storage system 1040 can be a tangible non-transitory computer-readable storage medium, i.e., a non-transitory device or article of manufacture that participates in storing instructions that can be provided to processor 1086 for execution.

In an example, data storage system 1040 includes code memory 1041, e.g., a RAM, and disk 1043, e.g., a tangible computer-readable rotational storage device such as a hard drive. Computer program instructions are read into code memory 1041 from disk 1043. Processor 1086 then executes one or more sequences of the computer program instructions loaded into code memory 1041, as a result performing process steps described herein. In this way, processor 1086 carries out a computer implemented process. For example, steps of methods described herein, blocks of the flowchart illustrations or block diagrams herein, and combinations of those, can be implemented by computer program instructions. Code memory 1041 can also store data, or can store only code.

Various aspects described herein may be embodied as systems or methods. Accordingly, various aspects herein may take the form of an entirely hardware aspect, an entirely software aspect (including firmware, resident software, micro-code, etc.), or an aspect combining software and hardware aspects. These aspects can all generally be referred to herein as a "service," "circuit," "circuitry," "module," or "system."

Furthermore, various aspects herein may be embodied as computer program products including computer readable program code stored on a tangible non-transitory computer readable medium. Such a medium can be manufactured as is conventional for such articles, e.g., by pressing a CD-ROM. The program code includes computer program instructions that can be loaded into processor 1086 (and possibly also other processors), to cause functions, acts, or operational steps of various aspects herein to be performed by the processor 1086 (or other processors). Computer program code for carrying out operations for various aspects described herein may be written in any combination of one or more programming language(s), and can be loaded from disk 1043 into code memory 1041 for execution. The program code may execute, e.g., entirely on processor 1086, partly on processor 1086 and partly on a remote computer connected to network 1050, or entirely on the remote computer.

Those having ordinary skill in the art will recognize that numerous modifications can be made to the specific implementations described above. The implementations should not be limited to the particular limitations described. Other implementations may be possible.

The invention claimed is:

1. An approximate cache system, comprising:
a quality aware cache controller (QACC) configured to receive address, data, and a read/write signal from a processor;
a cache, including
a data array comprising one or more ways, each way having one or more bytes, and each byte having one or more bit groups, and
a tag array comprising one or more ways each associated with the one or more ways of the data array; and
a quality table configured to receive addresses and a quality specification from the processor associated with each address, the quality specification corresponding to (i) permissible magnitude of error, (ii) error rate, and (iii) average error associated with data held in each address, the quality table further configured to provide the quality specification for each address to the QACC,
wherein the QACC at run-time determines an approach for each of read, write, and refresh operations associated with maximizing a figure of merit defined based on the achievable quality, energy usage, and the quality specification.

2. An approximate cache system, comprising:
a quality aware cache controller (QACC) configured to receive address, data, and a read/write signal from a processor;
a cache, including
a data array comprising one or more ways, each way having one or more bytes, and each byte having one or more bit groups, and
a tag array comprising one or more ways each associated with the one or more ways of the data array; and
a quality table configured to receive addresses and a quality specification from the processor associated with each address, the quality specification corresponding to one or more of (i) permissible magnitude of error, (ii) error rate, and (iii) average error associated with data held in each address, the quality table further configured to provide the quality specification for each address to the QACC,
a configurable read controller (CRDC) coupled to the QACC and configured to A) selectively define each bit group within bit groups of each byte of each way of the data array to be read associated with inputs from the QACC to select a circuit in the CRDC based on one of i) partial read operations where one or more least significant bits (LSBs) of the address are ignored for reading by being set according to all-0s, all-1s, alternate 0s and 1s, or a constant value; ii) lower read current operations, where a current smaller than a predetermined read current for an error-free read is passed through bit-cells of data array; and iii) no approximation error-free read operations; and B) read each bit group, accordingly, wherein the QACC at run-time determines an approach for each of read, write, and refresh operations associated with maximizing a figure of merit defined based on the achievable quality, energy usage, and the quality specification.

3. The approximate cache system of claim 2, wherein the circuit designs of the CRDC for each bit group are provided apriori at design time.

4. The approximate cache system of claim 2, further comprising a configurable write controller (CWRC) configured to A) selectively define each bit group within bit groups of each byte of each way of the data array to be written associated with inputs from the QACC to select a circuit in the CWDC based on one or more of i) skipped write operations, where a write to an address can be skipped based on whether the skipped write would violate the quality specification; ii) partial write operations, where one or more least significant bits (LSBs) of the address are ignored for writing; iii) lower write duration operations, where a current duration shorter than a predetermined write current duration for an error-free write is passed through bit-cells of the data array, iv) lower write current operations, where a current smaller than a predetermined write current for an error-free write is passed through bit-cells of data array, and v) error-free write operations; and B) write into each bit group, accordingly.

5. The approximate cache system of claim 4, wherein the circuit designs of the CWRC for each bit group except skipped write operations are provided apriori at design time, and wherein the skipped write operations circuit design of the CWRC occurs dynamically at runtime.

6. The approximate cache system of claim 2, further comprising a refresh controller configured to receive a refresh threshold ($N_{Th}$) signal from the QACC and thereby control refreshes of the data array associated with $N_{th}$ to select a circuit in the refresh controller based on i) skipping refreshes when the refresh controller determines during any one refresh cycle defined by $T_{Ret}$ a write operation has been performed on the data in the data array; or ii) incrementing a counter when refreshes have been skipped until the counter reaches $N_{Th}$, wherein $N_{Th}$ is determined based on the probability of retention failure (Pret_fail) and the quality specification, where $T_{Ret}$ is the time period with which refreshing bits would ensure no retention errors.

7. The approximate cache system of claim 6, wherein the data array is divided into one or more low retention ways and one or more high retention ways.

8. The approximation cache system of claim 7, wherein data at addresses designated with retention requirement less than a predetermined threshold are stored in the one or more low retention ways.

9. The approximate cache system of claim 8, wherein allowable time (t) to refresh a block in the low retention ways is calculated based on a first predefined mathematical function that relates the Pret_fail to t and $T_{Ret}$, and $N_{Th}$ is calculated based on a second predefined mathematical functional that relates $N_{Th}$ to t and $T_{Ret}$.

10. A method of controlling cache using approximation, comprising:
providing a quality aware cache controller (QACC) configured to receive address, data, and a read/write signal from a processor;
providing a cache, including
a data array comprising one or more ways, each way having one or more bytes, and each byte having one or more bit groups, and
a tag array comprising one or more ways each associated with the one or more ways of the data array; and
providing a quality table configured to receive addresses and a quality specification from the processor associated with each address, the quality specification corresponding to one or more of (i) permissible magnitude of error, (ii) error rate, and (iii) average error associated with data held in each address, the quality table further configured to provide the quality specification for each address to the QACC,
providing a configurable read controller (CRDC) coupled to the QACC and configured to A) selectively define each bit group within bit groups of each byte of each way of the data array to be read associated with inputs from the QACC to select a circuit in the CRDC based on one of i) partial read operations where one or more least significant bits (LSBs) of the address are ignored for reading by being set according to all-0s, all-1s, alternate 0s and 1s, or a constant value; ii) lower read current operations, where a current smaller than a predetermined read current for an error-free read is passed through bit-cells of data array; and iii) error-free read operations; and B) read each bit group, accordingly,
wherein the QACC at run-time determines an approach for each of read, write, and refresh operations associated with maximizing a figure of merit defined based on the achievable quality, energy usage, and the quality specification.

11. The method of claim 10, wherein the circuit designs of the CRDC for each bit group are provide apriori at design time.

12. The method of claim 10, further comprising providing a configurable write controller (CWRC) configured to A) selectively define each bit group within bit groups of each byte of each way of the data array to be written associated with inputs from the QACC to select a circuit in the CWDC based on one or more of i) skipped write operations, where a write to an address can be skipped based on whether the skipped write would violate the quality specification; ii) partial write operations, where one or more least significant bits (LSBs) of the address are ignored for writing; iii) lower write duration operations, where a current duration shorter than a predetermined write current duration for an error-free write is passed through bit-cells of the data array, iv) lower write current operations, where a current smaller than a predetermined write current for an error-free write is passed through bit-cells of data array, and v) error-free write operations; and B) write into each bit group, accordingly.

13. The method of claim 12, wherein the circuit design of the CWRC for each bit group except skipped write operations are provided apriori at design time, and wherein the skipped write operations selective definition of the CWRC occurs dynamically at runtime.

14. The method of claim 10, further comprising providing a refresh controller configured to receive a refresh threshold ($N_{Th}$) signal from the QACC and thereby control refreshes of the data array associated with $N_{th}$ to select a circuit in the refresh controller based on i) skipping refreshes when the refresh controller determines during any one refresh cycle defined by $T_{Ret}$ a write operation has been performed on the data in the data array; or ii) incrementing a counter when refreshes have been skipped until the counter reaches $N_{Th}$, wherein $N_{Th}$ is determined based on the probability of retention failure (Pret_fail) and the quality specification, where $T_{Ret}$ is the time period with which refreshing bits would ensure no retention errors.

15. The method of claim 14, wherein the data array is divided into one or more low retention ways and one or more high retention ways.

16. The method of claim 15, wherein data at addresses designated with retention requirement less than a predetermined threshold are stored in the one or more low retention ways.

17. The method of claim 16, wherein allowable time (t) to refresh a block in the low retention ways is calculated based on a first predefined mathematical function that relates the Pret_fail to t and $T_{Ret}$, and $N_{Th}$ is calculated based on a second predefined mathematical functional that relates $N_{Th}$ to t and $T_{Ret}$.

* * * * *